(12) United States Patent
Yeh (10) Patent No.: US 9,797,069 B2
(45) Date of Patent: Oct. 24, 2017

(54) SUBSTRATE WITH HIGH FRACTURE STRENGTH

(75) Inventor: Jer-Liang Andrew Yeh, Taichung (TW)

(73) Assignee: National Tsing Hua University, Hsinchu (TW)

( * ) Notice: Subject to any disclaimer, the term of this patent is extended or adjusted under 35 U.S.C. 154(b) by 115 days.

(21) Appl. No.: 12/534,203

(22) Filed: Aug. 3, 2009

(65) Prior Publication Data

US 2010/0035022 A1 Feb. 11, 2010

(30) Foreign Application Priority Data

Aug. 6, 2008 (TW) ............... 097129793 A (51) Int. Cl.
| H01L 23/00 | (2006.01) |
| C30B 33/10 | (2006.01) |
| B82Y 40/00 | (2011.01) |
| H01L 29/34 | (2006.01) |
| H01L 31/0236 | (2006.01) |
| H01L 29/06 | (2006.01) |

(52) U.S. Cl.
CPC .............. *C30B 33/10* (2013.01); *B82Y 40/00* (2013.01); *H01L 29/34* (2013.01); *H01L 31/02363* (2013.01); *H01L 29/0665* (2013.01); *Y02E 10/50* (2013.01); *Y10T 428/24355* (2015.01)

(58) Field of Classification Search
CPC .......... H01L 29/34; H01L 29/0665; H01L 31/02363; H01L 31/02366; C30B 33/00; C30B 33/08; C30B 33/10; C30B 33/12; B82Y 30/00; B82Y 10/00; Y02E 10/546; Y02E 10/547

USPC ........................................... 428/141
See application file for complete search history.

(56) References Cited

U.S. PATENT DOCUMENTS

| 2003/0067014 A1* | 4/2003 | Tsuruta et al. ............... 257/200 |
| 2003/0178057 A1* | 9/2003 | Fujii et al. ................... 136/256 |
| 2003/0180476 A1* | 9/2003 | Yamashita et al. ........... 428/1.1 |
| 2003/0201249 A1* | 10/2003 | Harker et al. ................ 216/54 |
| 2004/0065362 A1* | 4/2004 | Watabe et al. ............... 136/252 |
| 2008/0272396 A1* | 11/2008 | Fournel et al. ............... 257/190 |
| 2010/0117108 A1* | 5/2010 | Gaebler et al. ............... 257/98 |

FOREIGN PATENT DOCUMENTS

| WO | 2008023265 | 2/2008 | |
| WO | WO 2008023265 A1 * | 2/2008 | ..... H01L 31/022425 |
| WO | WO 2008037506 A1 * | 4/2008 | |

OTHER PUBLICATIONS

Office Action in related Taiwan Patent Application dated Dec. 29, 2011.

\* cited by examiner

*Primary Examiner* — Laura Auer
(74) *Attorney, Agent, or Firm* — Ming Chow; Sinorica, LLC (57) ABSTRACT

The invention discloses a substrate with high fracture strength. The substrate according to the invention includes a plurality of nanostructures. The substrate has a first surface, and the nanostructures are protruded from the first surface. By the formation of the nanostructures, the fracture strength of the substrate is enhanced.

9 Claims, 7 Drawing Sheets

| Si wafer [100] |||
| --- | --- | --- |
| surface type | fracture strength ($10^8$Pa) | Young's Modulus ($10^{11}$Pa) |
| no nanostructures | 2.2 ± 0.4 | 1.64±0.07 |
| with nanostructures | 4.5 ± 1.1 | 1.65±0.05 |

FIG. 6A

| Si wafer [111] ||
| --- | --- |
| surface type | fracture strength ($10^8$Pa) |
| no nanostructures | 2.6 ± 0.9 |
| with nanostructures | 4.3 ± 0.2 |

FIG. 6B

SUBSTRATE WITH HIGH FRACTURE STRENGTH

CROSS-REFERENCE TO RELATED APPLICATION

This utility application claims priority to Taiwan Application Serial Number 097129793, filed Aug. 6, 2008, which is incorporated herein by reference.

BACKGROUND OF THE INVENTION

1. Field of the Invention

The invention relates to a substrate, more particularly, to a substrate with high fracture strength.

2. Description of the Prior Art

With continuing development of semiconductor processing technologies, more and more semiconducting components have been researched and produced. In general, semiconducting components are implemented by forming several layer structures on a substrate. Therefore, the substrate has become the basic and must component.

For example, the solar cell in prior art usually utilizing a semiconductor wafer (e.g. Si wafer) as the substrate. However, the Si wafer belongs to the brittle material, which is easy to fracture by an outer impact, especially the outer impact in the assembling procedure of the solar cell. Besides the solar cell, Si wafers are generally utilized in various semiconductor products. With the increasing demanding of the semiconductor components, the supplement of the Si wafer is tightened. Therefore, it becomes an urgent problem about how to prevent the Si wafer material from wasted (e.g. fractured by an outer impact) and to elevate the yield of the process. In the example of the solar cell, if it is formed on a substrate with high fracture strength, the possibility of that the substrate happens to break in the assembling procedure can be eliminated.

Figure 1A:
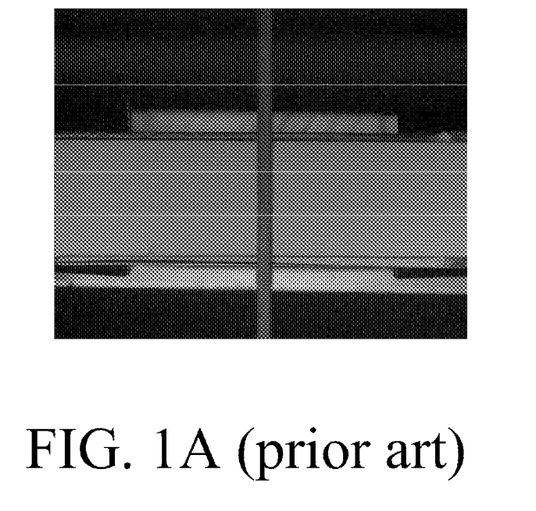
FIG. 1A and FIG. 1B are pictures shot in the fracture strength test on a test piece of a Si wafer in prior art.
Figure 1B:
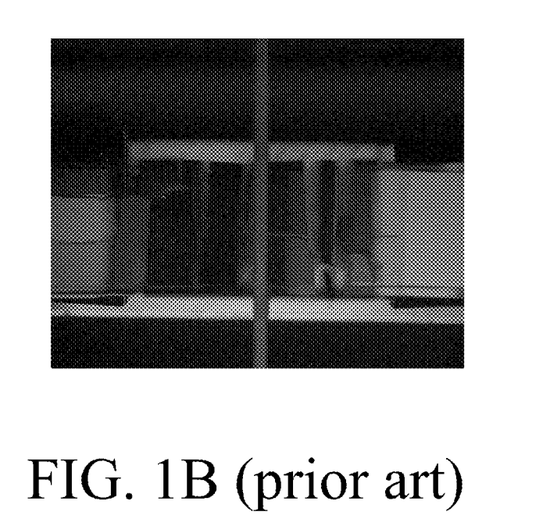

Please refer to FIG. 1A and FIG. 1B. FIG. 1A to FIG. 1B are pictures shot in the fracture strength test on a test piece of a Si wafer in prior art. The test piece of the Si wafer is made of monocrystalline silicon. During the period of stressing, the stress may concentrate on some particular areas of the test piece, where some cracks appears. With the stress increasing, the crack propagation becomes more obvious, and finally it will break the test piece into several pieces, as shown in FIG. 1B.

The test piece of the Si wafer in prior art will have the stress concentrated within the particular areas of the test piece. If the stress can be overspread to whole Si test piece evenly during the test, it may elevate the fracture strength.

Therefore, the invention discloses a substrate, so as to solve said problems.

SUMMARY OF THE INVENTION

A scope of the invention is to provide a substrate with high fracture.

According to an embodiment, the substrate has a plurality of first nanostructures. The substrate has a first surface. The first nanostructures are protruded from the first surface of the substrate. In other words, the substrate has the first nanostructures formed on its first surface. By forming the first nanostructures, the fracture strength of the substrate is enhanced.

The advantage and spirit of the invention may be understood by the following recitations together with the appended drawings.

DETAILED DESCRIPTION OF THE INVENTION

A scope of the invention is to provide a substrate with high fracture. The substrate can be used to produce any kinds of the semiconductor components, e.g. light emitting diodes (LED), solar cells, etc.

Figure 2A:
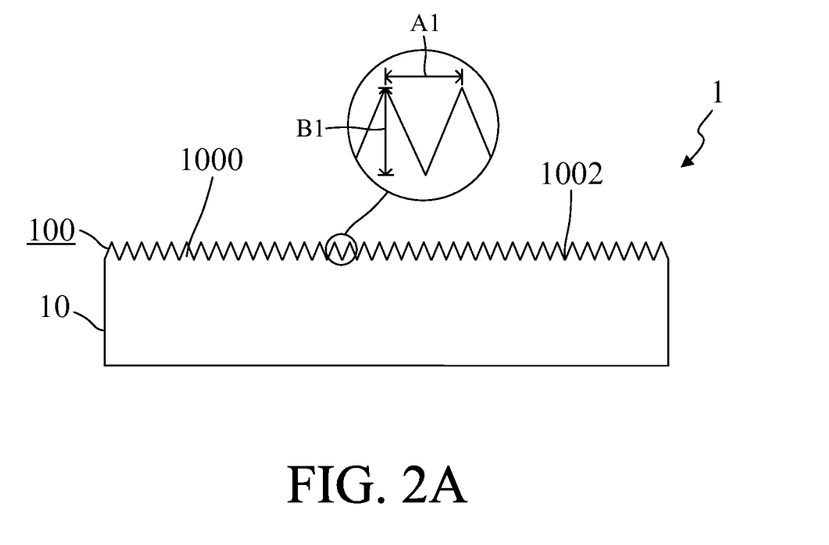
FIG. 2A and FIG. 2B are intersectional views illustrating a substrate according to an embodiment of the invention.
Figure 2B:
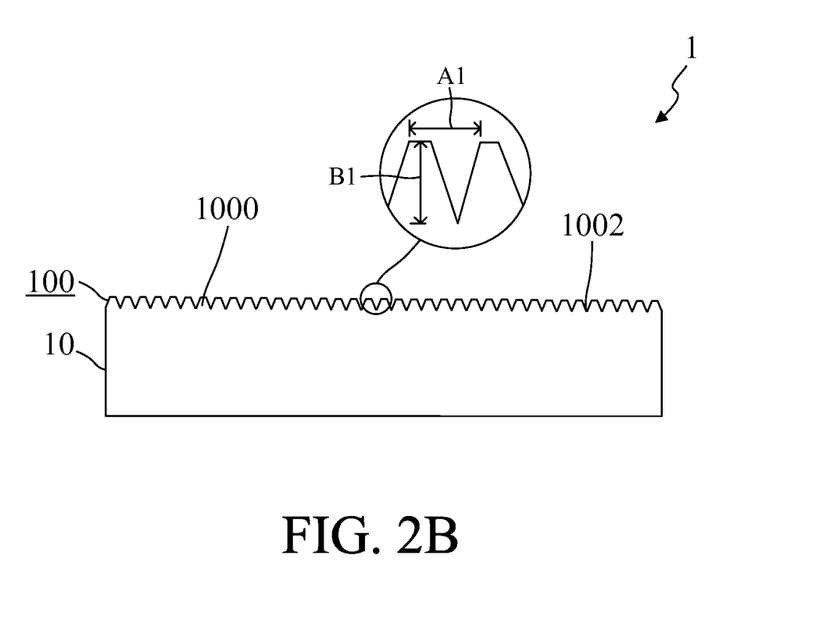

Please refer to FIG. 2A and FIG. 2B. FIG. 2A and FIG. 2B are intersectional views illustrating a substrate 1 according to an embodiment of the invention. In practical application, the substrate 1 of the invention can be a monocrystalline substrate or a polycrystalline substrate.

In practical application, the substrate can be made of, but not limited to, a material of glass, silicon, germanium, carbon, aluminum, GaN, GaAs, GaP, AlN, sapphire, spinel, $Al_2O_3$, SiC, ZnO, MgO, $LiAlO_2$, $LiGaO_2$ or $MgAl_2O_4$.

As shown in FIG. 2A and FIG. 2B, the substrate 1 has a plurality of first nanostructures 1000. The first nanostructures 1000 can be shaped as a nanotip shown in FIG. 2A or a nanorod (nanopiller) shown in FIG. 2B.

The substrate 1 has a first surface 100. The first nanostructures 1000 is protruded from the first surface 100 of the substrate 1. In other words, the substrate 1 has the first nanostructures 1000 formed on its first surface 100. Therefore, the substrate 1 and the nanostructures 1000 are made of the same material. In an embodiment, if the substrate 1 is a monocrystalline substrate, the first surface 100 of the monocrystalline substrate may have a crystal orientation, which can be [100] or [111]. By forming the first nanostructures 1000, the fracture strength of the substrate 1 is enhanced.

Figure 3A:
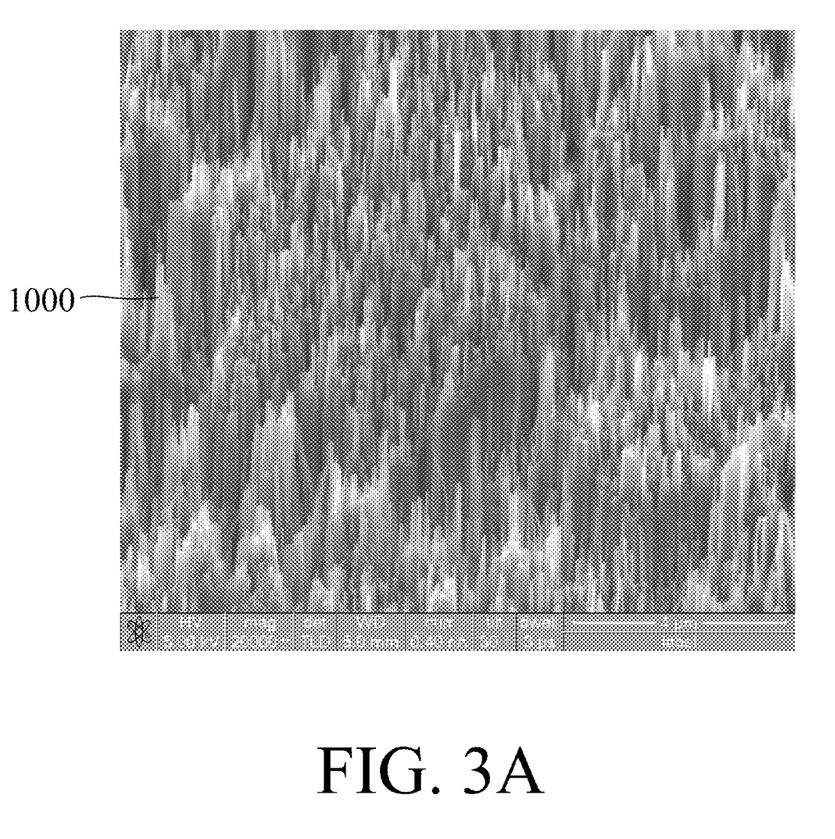
FIG. 3A is an outside view illustrating the first nanostructures of the substrate according to the invention.
Figure 3B:
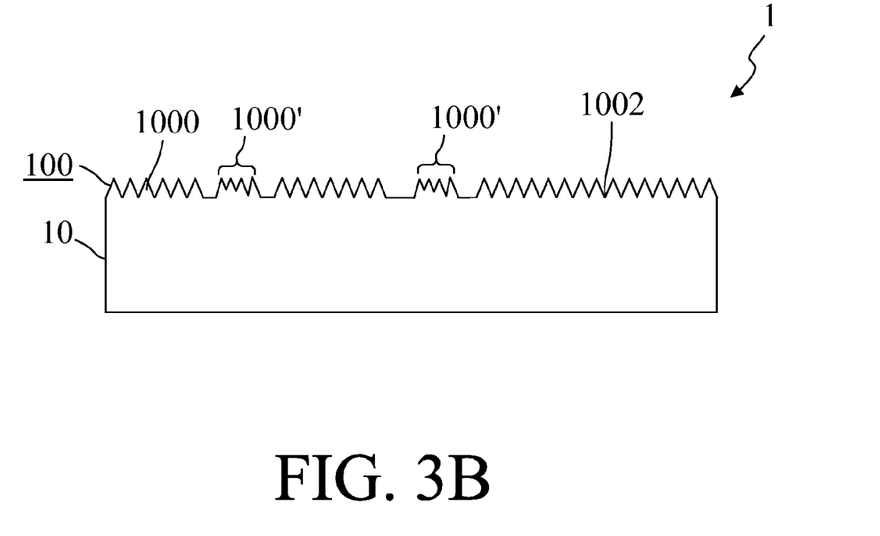
FIG. 3B is an example illustrating a distributing formation of the first nanostructures according to an embodiment of the invention.

To be noticed that FIG. 2A and FIG. 2B are schematic diagrams for demonstrating the shape of the first nanostructures 1000 in the invention. In practical applications, the first nanostructures 1000 are preferably shaped like individual or adjacent protruding rods. Please refer to FIG. 3A. FIG. 3A is an outside view illustrating the first nanostructures 1000 of the substrate according to the invention. The first nanostructures 1000 are formed compactly on the first surface of the substrate. Each nanostructure 1000 can be a protruding rod protruded from the substrate (shown in FIG. 3A). To be noticed that, the first nanostructures 1000 can be formed on the first surface of the substrate orderly or randomly. Please also refer to FIG. 3B. FIG. 3B is an example illustrating a distributing formation of the first nanostructures according to an embodiment of the invention. Each first nanostructure 1000 can be formed independently on the first surface 100 of the substrate 1, on the other hand, multiple adjacent first nanostructures 1000 can also be formed a group 1000' (shown in FIG. 3B). In practical application, the first nanostructures 1000 can be formed in a way of etching process, e.g. the electrochemical etching process.

Please refer to the enlarged parts in FIG. 2A and FIG. 2B. For demonstrating the shape of the first nanostructures 1000 in detail, a first aspect ratio R1 is defined by the first nanostructures 1000. The formula of the first aspect ratio is R1=B1/A1, wherein A1 is a gap width between two adjacent tops of the first nanostructures 1000, and B1 is a height of each first nanostructure 1000. In an embodiment, the gap width between two adjacent tops of the first nanostructures 1000 can be in the range of several tens of nanometers to several hundreds of nanometers, and the height of each first nanostructure 1000 can be in the micrometer scale. The first aspect ratio is affected by some etching indices of the etching process, e.g. the etching time and the etching temperature. According to the experimental result, the first aspect ratio R1 can be larger than 1.5. In a preferable embodiment, the first aspect ratio R1 is in the range of 2 to 4.

Figure 4:
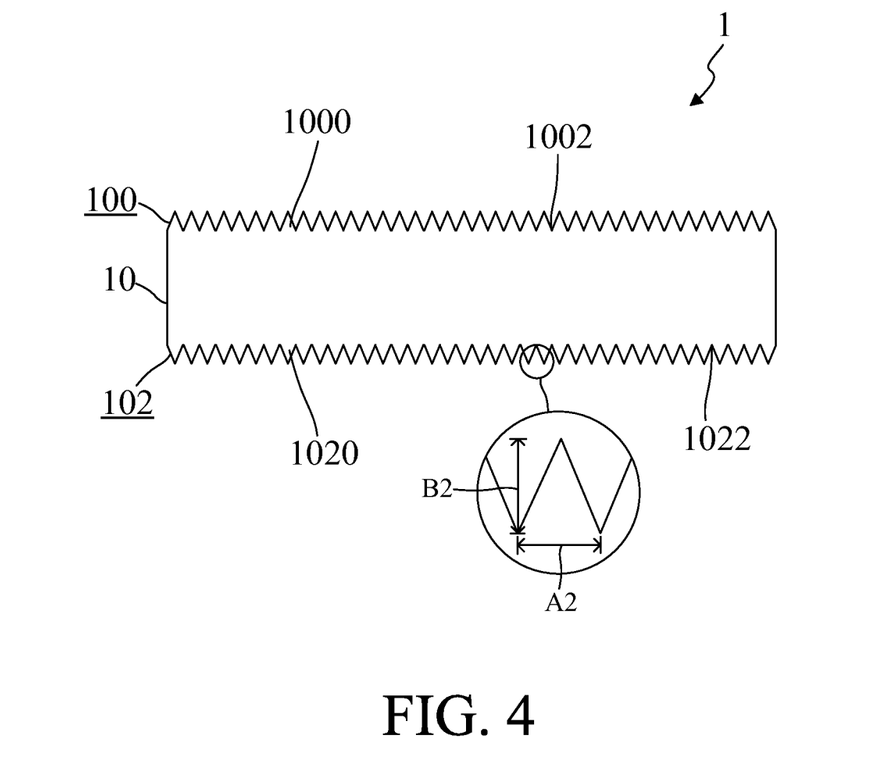
FIG. 4 is a sectional view illustrating the substrate according to another embodiment of the invention.

Please refer to FIG. 4. FIG. 4 is a sectional view illustrating the substrate 1 according to another embodiment of the invention.

As shown in FIG. 4, the substrate 1 further has a second surface 102 opposite to the first surface 100. Besides the first nanostructures 1000 formed on the first surface 100 of the substrate 1, the substrate 1 further includes a plurality of second nanostructures 1020 protruding from the second surface 102 of the substrate 1. In the embodiment, the substrate 1 and the second nanostructures 1020 are also made of the same material.

Equivalently, the second nanostructures 1020 can be shaped as a nanotip or a nanorod. The distribution of the second nanostructures 1020 on the second surface 102 of the substrate 1 can be similar to the one of the first nanostructures 1000, so it is not repeated here. In practical application, the second nanostructures 1020 can be also formed in the way of etching process, e.g. the electrochemical etching process.

As shown in the enlarged part of FIG. 4. A second aspect ratio R2 is defined by the second nanostructures 1020. The formula of the second aspect ratio is R2=B2/A2, wherein A2 is a gap width between two adjacent tops of the second nanostructures 1020, and B1 is a height of each second nanostructure 1020. In an embodiment, the gap width between two adjacent tops of the second nanostructures 1020 can be in the range of several tens of nanometers to several hundreds of nanometers, and the height of each second nanostructure 1020 can be in the micrometer scale. In a preferable embodiment equivalent to the first aspect ratio of the first nanostructure 1000, the second aspect ratio R2 of the second nanostructure 1020 is in the range of 2 to 4.

Figure 5A:
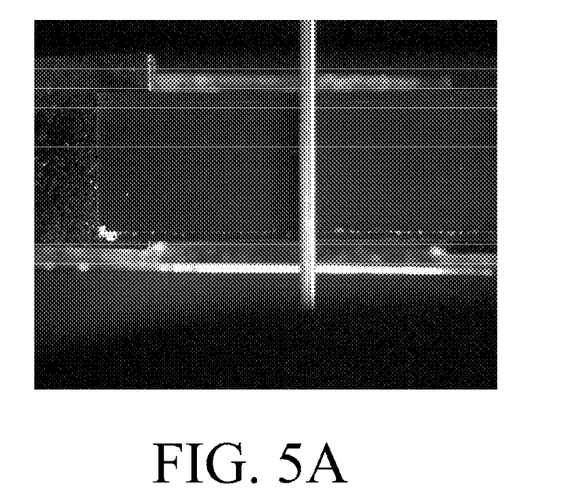
FIG. 5A and FIG. 5B are pictures shot in the fracture strength test of the substrate according to the invention.
Figure 5B:
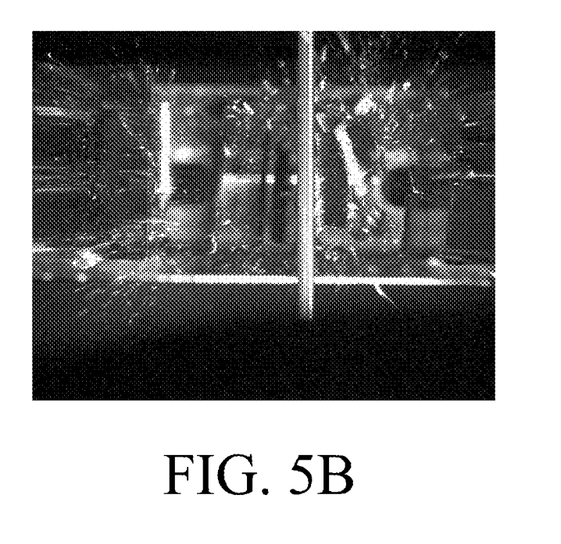

The fracture strength of the substrate according to the invention can be measured by the three-point bending strength test. Please refer to FIG. 5A and FIG. 5B. FIG. 5A and FIG. 5B are pictures shot in the fracture strength test of the substrate according to the invention. During this fracture strength test, it takes a monocrystalline test piece for demonstration. The surface of the monocrystalline test piece has have a crystal orientation of [100] or [111].

As shown in FIG. 5A to FIG. 5B, when the test piece is beyond its bearing, the test piece fracture is smashed. The smashing phenomenon shows that the test piece is fractured under ultimate energy. There is a corresponding example from the fracture difference between a bullet-proof glass and a normal glass, which may imply that the test piece in FIG. 5A to FIG. 5B has better fracture strength than the test piece in FIG. 1A to FIG. 1B.

Figure 6A:
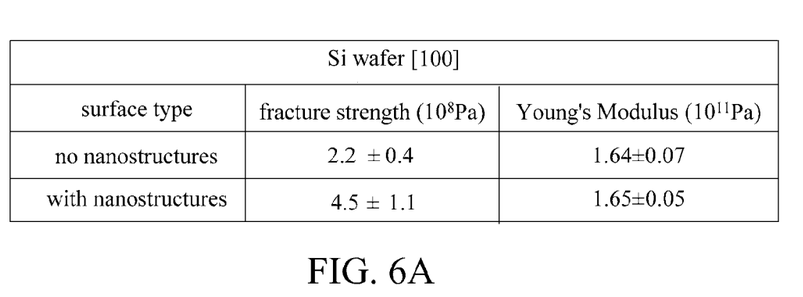
FIG. 6A and FIG. 6B are testing data from the fracture strength test of the substrate according to the invention.
Figure 6B:
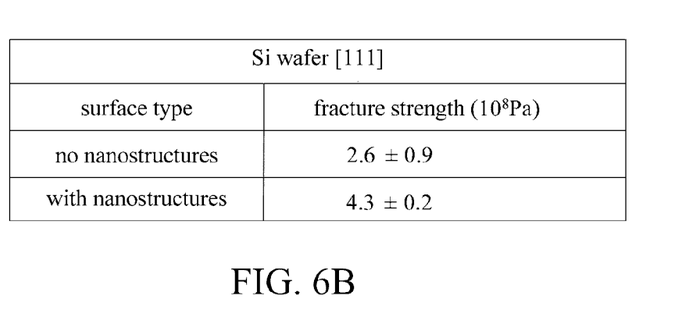

Please refer to FIG. 6A and FIG. 6B. FIG. 6A and FIG. 6B are testing data from the fracture strength test of the substrate according to the invention. There are two monocrystalline test pieces respectively with [100] crystal orientation and [111] crystal orientation for demonstrating. To be noticed that, in the fracture strength test, the cracks on the test piece usually appear on the stressed surface, and then further extends. Therefore, the fracture strength test in the invention focuses on the Si wafer with nanostructures on the stressed surface.

Please refer to FIG. 2A and FIG. 2B again. The first nanostructures 1000 are protruded from the first surface 100 of the substrate 1. Therefore, there is a plurality of first notches 1002 formed between the first nanostructures 1000. The reason, about how the fracture strength can be considerably elevated, is probably that the stress can be evenly distributed to the first notches 1002 of the Si wafer according to the invention, rather than being concentrated within some specific area in traditional design. While the loading increasing, each first notch 1002 may have a crack, which may be further extended and lead to the smashing fracture of the Si wafer. Because the stress-distributing function of the first notches 1002, the Si wafer in the invention can stand larger load and have better fracture strength than traditional Si wafer. Equivalently, there can also be a plurality of second notches 1022 between the second nanostructures 1020.

In another point of view, the substrate 1 generally comprises a substrate body 10 and a plurality of first nanostructures 1000. More practically, the substrate body 10 comprises a first surface 100 for the plurality of first nanostructure 1000 to form thereon and protrude therefrom such that the fracture strength of the substrate 1 is increased in comparison with the substrate without the first nanostructure. Furthermore, as shown in FIG. 6A and FIG. 6B, no matter the crystal orientation is [100] or [111], the measured fracture strength of the Si wafer is considerably enhanced or increased.

It can be concluded that the monocrystalline test piece of FIG. 5A to FIG. 5B has better fracture strength compared to the monocrystalline test piece in prior art. Besides, these two Si wafers with different crystal orientation types has substantially the same Young's Modulus. It is saying that, the fracture strength of the monocrystalline test piece according to the invention can be enhanced in the way of surface processing and without changing the material. More specifically, according to the table shown in FIG. 6A, the fracture strength of a Si Wafer or substrate, having the crystal orientation of [100], can be increased for at least 30.7 percents by forming nanostructures thereon. More specifically, the number of 30.7 percents is obtained by comparing the lower limit ($3.4*10^8$ Pa) of the fracture strength of the substrate 1 with nanostructures to the higher limit ($2.6*10^8$ Pa) of the fracture strength of the substrate 1 without nanostructure formed thereon. However, while the crystal orientation of the substrate 1 is [111] instead of [100], the increase rate thereof shall be limited to at least 17 percents correspondingly.

In a preferable embodiment, the nanostructures are formed on the stress-bearing surface of the substrate according to the invention, such that the nanostructures can fully function. To be noticed that, the nanostructures are not limited to be located on the stress-bearing surface, but to be implemented according to the practical application.

Compared to prior art, the substrate of the invention has high fracture strength, such that the substrate can withstand an outer impact without being broken. Accordingly, the substrate of the invention can prevent the Si wafer material from wasted and elevate the yield of the process.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A substrate with high fracture strength comprising:
   a substrate body;
   the substrate body comprising a first surface and a second surface;
   the second surface being opposite to the first surface;
   a plurality of first nanostructures;
   the plurality of first nano structures protruding from the first surface of the substrate body, such that a fracture strength of the substrate is increased in comparison with another substrate without another nanostructure formed thereon;
   each of the plurality of first nanostructures being one piece formed with the first surface of the substrate body;
   each of the plurality of first nanostructures substantially forming a first nanorod with a first flat top;
   a first width of each of the plurality of first nanostructures being decreased from the first surface of the substrate body respectively;
   a first aspect ratio R1;
   the first aspect ratio R1 being defined by a formula of R1=B1/A1, where A1 is a gap width between any two adjacent first flat tops of the plurality of first nanostructures, B1 is a height of each of the plurality of first nanostructures;
   the first aspect ratio R1 being larger than 3.0 and less than 4.0;
   a plurality of second nanostructures;
   the plurality of second nanostructures protruding from the second surface of the substrate body, such that the fracture strength of the substrate is further increased in comparison with the another substrate without the another nanostructure formed thereon;
   each of the plurality of second nanostructures being one piece formed with the second surface of the substrate body;
   each of the plurality of second nanostructures substantially forming a second nanorod with a second flat top;
   a second width of each of the plurality of second nanostructures being decreased from the second surface of the substrate body respectively;
   a second aspect ratio R2;
   the second aspect ratio R2 being defined by a formula of R2=B2/A2, where A2 is a gap width between any two adjacent second flat tops of the plurality of second nanostructures, B2 is a height of each of the plurality of second nanostructures; and
   the second aspect ratio R2 being greater than 3.0 and less than 4.0.

2. The substrate of claim 1, wherein the substrate body is a monocrystalline substrate.

3. The substrate of claim 1, wherein the height of each first nanostructure is in the micrometer scale.

4. The substrate of claim 1, wherein the plurality of first nanostructures are formed by an electrochemical etching process.

5. The substrate of claim 1, wherein the first surface is a tension bearing surface of the substrate.

6. The substrate of claim 1, wherein the height of each second nanostructure is in the micrometer scale.

7. The substrate of claim 2, wherein the substrate body is a monocrystalline silicon substrate.

8. The substrate of claim 7, wherein a crystal orientation of the first surface of the monocrystalline silicon substrate is [100] or [111].

9. The substrate of claim 1, wherein the substrate body is a polycrystalline substrate.

* * * * *